United States Patent
Liu et al.

(10) Patent No.: US 12,464,635 B2
(45) Date of Patent: Nov. 4, 2025

(54) FLEXIBLE PRINTED CIRCUIT BOARD AND METHOD FOR MANUFACTURING THE SAME, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Wen Liu, Beijing (CN); Xin Li, Beijing (CN); Zhixin Cui, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 18/254,816

(22) PCT Filed: Apr. 24, 2022

(86) PCT No.: PCT/CN2022/088814
§ 371 (c)(1),
(2) Date: May 26, 2023

(87) PCT Pub. No.: WO2023/205958
PCT Pub. Date: Nov. 2, 2023

(65) Prior Publication Data
US 2024/0397608 A1    Nov. 28, 2024

(51) Int. Cl.
H05K 1/02    (2006.01)

(52) U.S. Cl.
CPC ........... H05K 1/0218 (2013.01); H05K 1/028 (2013.01); H05K 2201/0715 (2013.01); H05K 2201/10128 (2013.01)

(58) Field of Classification Search
CPC ................. H05K 1/0218; H05K 1/028; H05K 2201/0715; H05K 2201/10128
(Continued)

(56) References Cited

U.S. PATENT DOCUMENTS

| | | | |
|---|---|---|---|
| 6,252,298 B1 | 6/2001 | Lee et al. | |
| 2012/0241205 A1* | 9/2012 | Shimizu | H01L 24/18 29/829 |

(Continued)

FOREIGN PATENT DOCUMENTS

| | | |
|---|---|---|
| CN | 200990719 Y | 12/2007 |
| CN | 102143648 A | 8/2011 |

(Continued)

*Primary Examiner* — Binh B Tran
(74) *Attorney, Agent, or Firm* — XSENSUS LLP

(57) ABSTRACT

A flexible printed circuit board includes a substrate, a first conductive layer, a first protective layer and a support body. The substrate has a device region and a non-device region, and the device region is configured to be coupled to a chip. The first conductive layer is located on a side of the substrate. The first protective layer is located on a side of the first conductive layer away from the substrate. The first protective layer is provided therein with an accommodation space. The support body is located at least in the accommodation space. An orthographic projection of the support body on the substrate at least overlaps with at least one of the device region and the non-device region of the substrate.

19 Claims, 10 Drawing Sheets

(58) Field of Classification Search
USPC .......................................................... 361/749
See application file for complete search history.

(56) References Cited

U.S. PATENT DOCUMENTS

2013/0192884 A1* 8/2013 Furutani ................. H01L 24/19
                                                      174/258
2015/0043183 A1* 2/2015 Ishiguro ................. H05K 1/185
                                                      174/251
2023/0198128 A1* 6/2023 Oh ...................... H04M 1/0277
                                                      343/702

FOREIGN PATENT DOCUMENTS

| CN | 206212409 U | 5/2017 |
| CN | 107846779 A | 3/2018 |
| CN | 210016683 U | 2/2020 |
| CN | 107644593 B | 6/2020 |
| CN | 113347812 A | 9/2021 |
| WO | 2021/051670 A1 | 3/2021 |

* cited by examiner

FLEXIBLE PRINTED CIRCUIT BOARD AND METHOD FOR MANUFACTURING THE SAME, AND DISPLAY DEVICE

CROSS-REFERENCE TO RELATED APPLICATION

This application is a national phase entry under 35 USC 371 of International Patent Application No. PCT/CN2022/088814, filed on Apr. 24, 2022, which is incorporated herein by reference in its entirety.

TECHNICAL FIELD

The present disclosure relates to the field of display technologies, and in particular, to a flexible printed circuit board and a method for manufacturing the same, and a display device.

BACKGROUND

Flexible printed circuit boards (FPCs) are currently widely used in many display devices such as mobile phones, notebook computers, wearable devices, and tablet computers due to their high wiring density, small weight, small thickness, and bending ability.

SUMMARY

In an aspect, a flexible printed circuit board is provided. The flexible printed circuit board includes a substrate, a first conductive layer, a first protective layer and a support body. The substrate has a device region and a non-device region, and the device region is configured to be coupled to a chip. The first conductive layer is located on a side of the substrate. The first protective layer is located on a side of the first conductive layer away from the substrate. The first protective layer is provided therein with an accommodation space. The support body is located at least in the accommodation space, and an orthographic projection of the support body on the substrate at least overlaps with the device region of the substrate and/or the non-device region of the substrate.

In some embodiments, the support body penetrates through the first protective layer.

In some embodiments, the device region of the substrate is located in the orthographic projection of the support body on the substrate; and/or the orthographic projection of the support body on the substrate is located in the non-device region of the substrate.

In some embodiments, a border of the orthographic projection of the support body on the substrate substantially overlaps with a border the device region; and/or the border of the orthographic projection of the support body on the substrate substantially overlaps with a border the non-device region.

In some embodiments, a material of the support body includes polypropylene.

In some embodiments, the flexible printed circuit board further includes a first shielding layer. The first shielding layer is located on a side of the first protective layer away from the substrate, and covers the first protective layer and the support body.

In some embodiments, the flexible printed circuit board further includes a second conductive layer and a second shielding layer. The second conductive layer is located on a side of the substrate away from the first conductive layer and located in a region outside the non-device region. The second shielding layer is located on the side of the substrate away from the first conductive layer. The second shielding layer covers the second conductive layer and an exposed surface of the substrate in the non-device region.

In some embodiments, the second shielding layer includes a connection opening penetrating through the second shielding layer, and the connection opening is configured such that the chip is coupled to the second conductive layer through the connection opening.

In some embodiments, a dimension of the first protective layer in a direction perpendicular to the substrate is greater than a dimension of the first conductive layer in the direction perpendicular to the substrate.

In some embodiments, a ratio of a dimension of the first conductive layer in a direction perpendicular to the substrate to a dimension of the first protective layer in the direction perpendicular to the substrate is in a range from 0.25 to 0.8.

In some embodiments, a dimension of the support body in a direction perpendicular to the substrate is greater than or equal to a dimension of the first protective layer in the direction perpendicular to the substrate.

In yet another aspect, a display device is provided. The display device includes a display panel and a flexible printed circuit board. The flexible printed circuit board is located on a back side of the display panel and coupled to the display panel. The back side of the display panel is a side opposite to a display side of the display panel. The flexible printed circuit board is the flexible printed circuit board as described in any one of the above embodiments.

In some embodiments, a surface of the display panel proximate to the flexible printed circuit board is provided with a protruding portion; and at least part of the protruding portion is fitted into the non-device region of the flexible printed circuit board.

In yet another aspect, a method for manufacturing a flexible printed circuit board is provided. The method for manufacturing the flexible printed circuit board includes: providing a substrate, the substrate having a device region and a non-device region; forming a first conductive layer on a side of the substrate; and forming a first protective layer and a support body on a side of the first conductive layer away from the substrate. The first protective layer is provided therein with an accommodation space, the support body is at least partially located in the accommodation space, and an orthographic projection of the support body on the substrate at least overlaps with the device region of the substrate and/or the non-device region of the substrate.

In some embodiments, forming the first protective layer and the support body on the side of the first conductive layer away from the substrate includes: forming the first protective layer on the side of the first conductive layer away from the substrate; and filling the support body in the accommodation space.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art may obtain other drawings according to these drawings.

In addition, the accompanying drawings to be described below may be regarded as schematic diagrams, but are not

DETAILED DESCRIPTION

Figure 1:
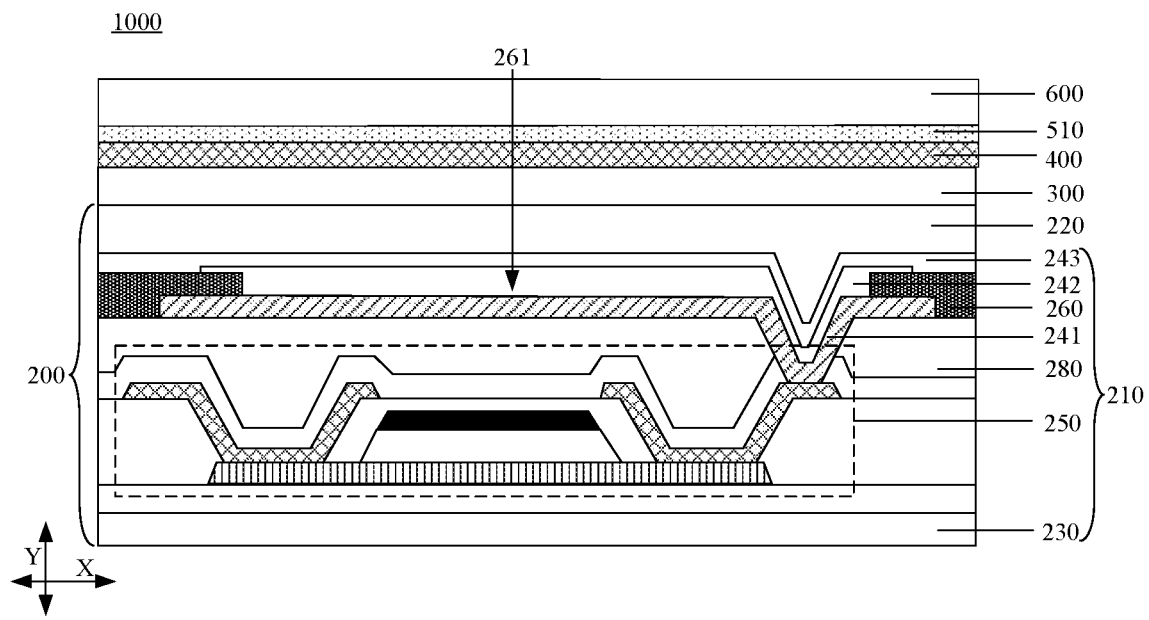
FIG. 1 is a structural diagram of a display device, in accordance with some embodiments.

Technical solutions in some embodiments of the present disclosure will be described clearly and completely with reference to the accompanying drawings below. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, the term "comprise" and other forms thereof such as the third-person singular form "comprises" and the present participle form "comprising" throughout the specification and the claims are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representation of the above terms do not necessarily refer to the same embodiment(s) or example(s). In addition, the specific features, structures, materials or characteristics may be included in any one or more embodiments or examples in any suitable manner.

Hereinafter, the terms "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the terms "a plurality of", "the plurality of" and "multiple" each mean two or more unless otherwise specified.

In the description of some embodiments, the terms "coupled", "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is optionally construed as "when" or "in a case where" or "in response to determining" or "in response to detecting", depending on the context. Similarly, depending on the context, the phrase "if it is determined that" or "if [a stated condition or event] is detected" is optionally construed as "in a case where it is determined that" or "in response to determining that" or "in a case where [the stated condition or event] is detected" or "in response to detecting [the stated condition or event]".

The use of the phrase "applicable to" or "configured to" herein means an open and inclusive expression, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values beyond those stated.

As used herein, the term such as "about", "substantially" or "approximately" includes a stated value and an average value within an acceptable range of deviation of a particular value. The acceptable range of deviation is determined by a person of ordinary skill in the art in view of measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and areas of regions are enlarged for clarity.

Variations in shapes with respect to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown to have a rectangular shape generally has a feature of being curved. Therefore, the regions shown in the accompanying drawings are schematic in nature, and their shapes are not intended to show actual shapes of regions in a device, and are not intended to limit the scope of the exemplary embodiments.

In the related art, a flexible printed circuit board (FPC) includes a device region and a non-device region. Due to the soft material of the FPC, during a surface mounted technology (SMT) process, the FPC in the device region does not have enough support and is prone to deformation such as bending, resulting in abnormal mounting (e.g., faulty mounting, Tin missing, or displacement). Therefore, the yield of the FPC is reduced. In addition, during the reflow soldering after the SMT process is finished, "thermal expansion" occurs inside the FPC in a high temperature environment. Due to a small thickness of the FPC in the non-device region, the stress of the FPC is concentrated in the non-device region, so that the FPC in the non-device region is prone to deformation (e.g., wrinkles, warping, etc.), which will also reduce the yield of the FPC.

Based on this, some embodiments of the present disclosure provide a flexible printed circuit board and a method for manufacturing the same, and a display device, which are introduced below.

Figure 13:
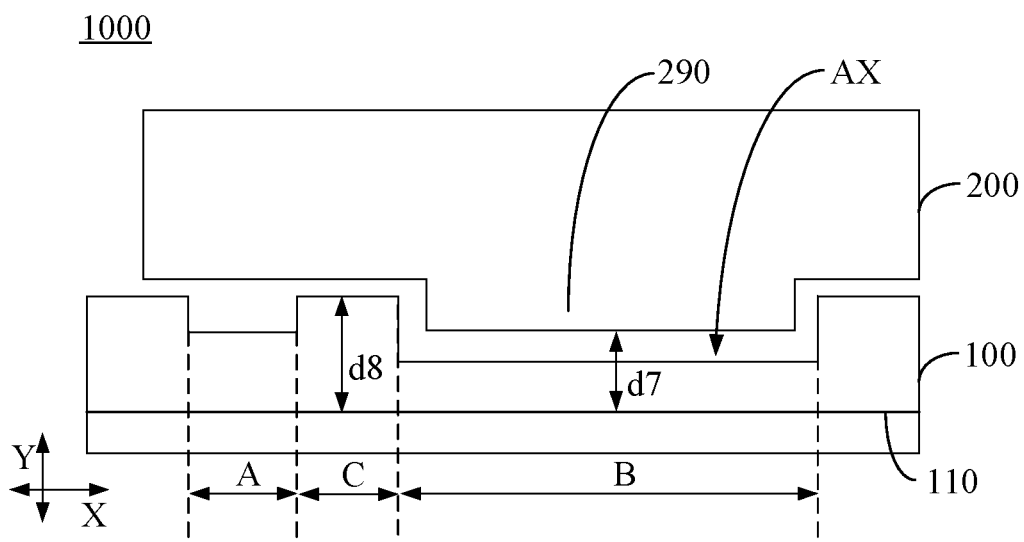
FIG. 13 is a structural diagram of a display device, in accordance with some embodiments.

As shown in FIGS. 1 and 13, the embodiments of the present disclosure provide the display device 1000. The display device may be any device that displays images whether in motion (e.g., a video) or stationary (e.g., a static image), and whether textual or graphical. More specifically, it is expected that the embodiments may be implemented in or associated with a plurality of electronic devices. The plurality of electronic devices may be (but not limited to), for example, mobile phones, wireless devices, personal digital assistants (PDAs), hand-held or portable computers, global positioning system (GPS) receivers/navigators, cameras, MPEG-4 Part 14 (MP4) video players, video cameras, game consoles, watches, clocks, calculators, television (TV) monitors, flat panel displays, computer monitors, automobile displays (e.g., odometer displays), navigators, cockpit controllers and/or displays, camera view displays (e.g., rear view camera displays in a vehicle), electronic photos, electronic billboards or signages, projectors, architectural structures, packaging and aesthetic structures (e.g., displays for displaying images of a piece of jewelry).

The display device 1000 includes a frame, and a display panel 200, a flexible printed circuit board 100, a display driver integrated circuit (IC) and other electronic components that are disposed in the frame.

The display panel 200 may be an organic light-emitting diode (OLED) display panel, a quantum dot light-emitting diode (QLED) display panel, or a micro light-emitting diode (micro LED) display panel, which is not specifically limited in the present disclosure.

The following embodiments of the present disclosure are all described by taking an example in which the display panel 200 is an OLED display panel to illustrate the present disclosure. However, it should be noted that the display device 1000 is not limited to an OLED display device.

In some embodiments, as shown in FIG. 1, the main structures of the display device 1000 include a display panel 200, a touch structure 300, an anti-reflection structure (e.g., a polarizer 400), a first optically clear adhesive (OCA) layer 510 and a cover plate 600 that are arranged in sequence. In some embodiments, the anti-reflection structure may include a color filter and a black matrix.

The display panel 200 includes a display substrate 210 and an encapsulation layer 220 for encapsulating the display substrate 210. The encapsulation layer 220 may be an encapsulation film or an encapsulation substrate.

In some embodiments, the touch structure 300 may be a flexible multilayer on cell (FMLOC) structure. For example, the touch structure 300 includes two layers of touch electrodes.

In some embodiments, as shown in FIG. 1, the touch structure 300 is directly disposed on the encapsulation layer 220 of the display panel 200. In this way, the display substrate 210 may be regarded as a base substrate of the touch structure 300, thereby facilitating the lightness and thinness of the display device 1000.

In some embodiments, the encapsulation layer 220 may include a first inorganic encapsulation layer, a first organic encapsulation layer and a second inorganic encapsulation layer; or the encapsulation layer 220 may be a stacked structure of at least one organic layer and at least one inorganic layer. In some embodiments, the anti-reflection structure may be formed in the encapsulation layer 220 to play an anti-reflection function, so that the thickness of the display device 1000 may be further reduced.

Figure 2:
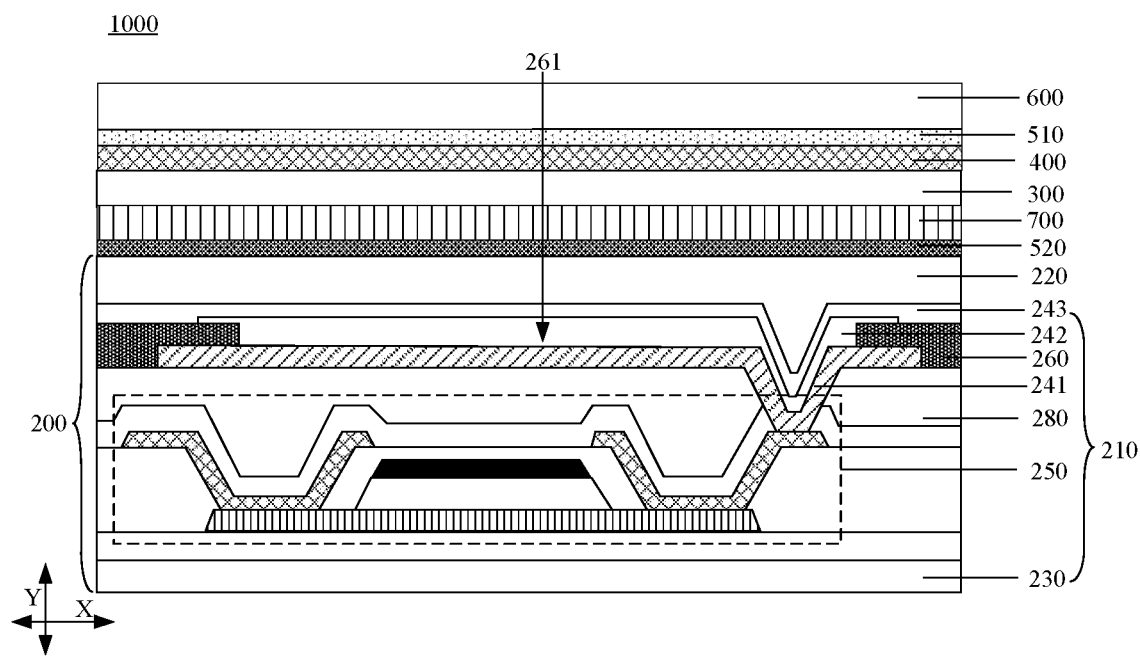
FIG. 2 is a structural diagram of a display device, in accordance with some embodiments.

In some other embodiments, as shown in FIG. 2, the touch structure 300 is disposed on a base substrate 700, and the base substrate 700 is adhered to the encapsulation layer 220 through a second optically clear adhesive 520. A material of the base substrate 700 may be, for example, polyethylene terephthalate (PET), polyimide (PI), or cyclo olefin polymer (COP).

As shown in FIG. 1, each sub-pixel of the display substrate 210 includes a light-emitting device and a driving circuit that are disposed on a base 230. The driving circuit includes a plurality of thin film transistors 250. The light-emitting device includes an anode 241, a light-emitting layer 242 and a cathode 243. The anode 241 is directly or indirectly coupled to a drain of a thin film transistor 250, serving as a driving transistor, among the plurality of thin film transistors 250 in the driving circuit.

In some embodiments, in a case where the anode 241 is coupled to the drain of the thin film transistor 250, serving as the driving transistor, among the plurality of thin film transistors 250 in the driving circuit, the anode 241 and the drain may be coupled through a transfer electrode, and the transfer electrode is located between a film layer where the drain is located and a film layer where the anode 241 is located.

The display substrate 210 further includes a pixel defining layer 260, the pixel defining layer 260 includes a plurality of light-exit openings, and a light-emitting device 240 corresponds to a light-exit opening.

In some embodiments, a display functional layer includes the light-emitting layer 242. In some other embodiments, in addition to the light-emitting layer 242, the display functional layer further includes one or more of an electron transport layer (ETL), an electron injection layer (EIL), a hole transport layer (HTL) and a hole injection layer (HIL).

As shown in FIG. 1, the display substrate 210 further includes at least one planarization layer 280 disposed between the thin film transistors 250 and the anode 241. In some embodiments, at least one passivation layer is further provided on the planarization layer 280.

In a case where the display device 1000 is an electroluminescent display device, the display device 1000 may be a top-emission display device. In this case, the anode 241 close to the base 230 is opaque, and the cathode 243 far away from the base 230 is transparent or translucent. Alternatively, the display device 1000 may be a bottom-emission display device. In this case, the anode 241 close to the base 230 is transparent or translucent, and the cathode 243 far away from the base 230 is opaque.

Figure 3:
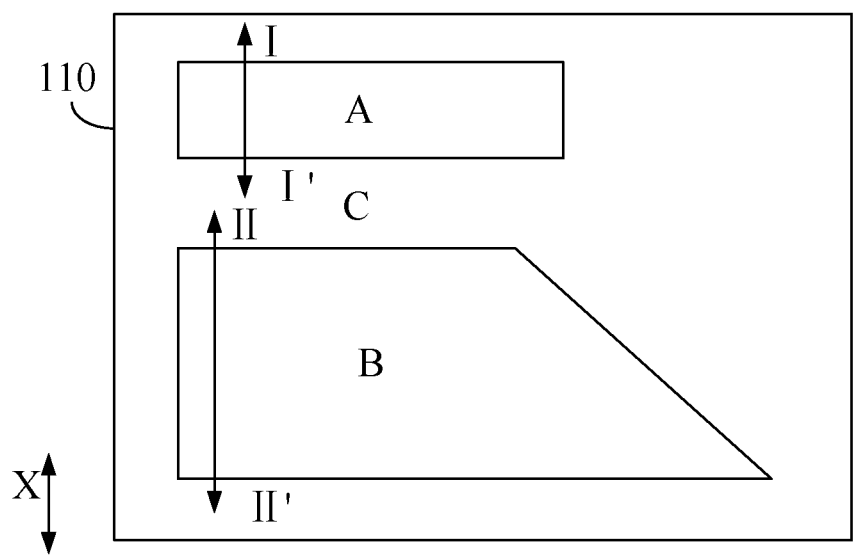
FIG. 3 is a structural diagram of a substrate of a flexible printed circuit board, in accordance with some embodiments.
Figure 4:
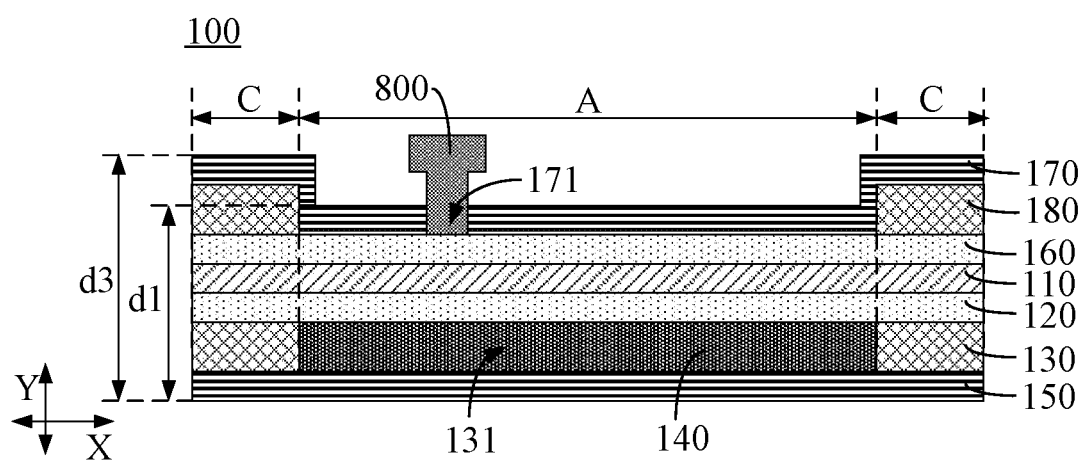
FIG. 4 is a sectional view of the structure in FIG. 3 taken along the I-I' line.
Figure 5:
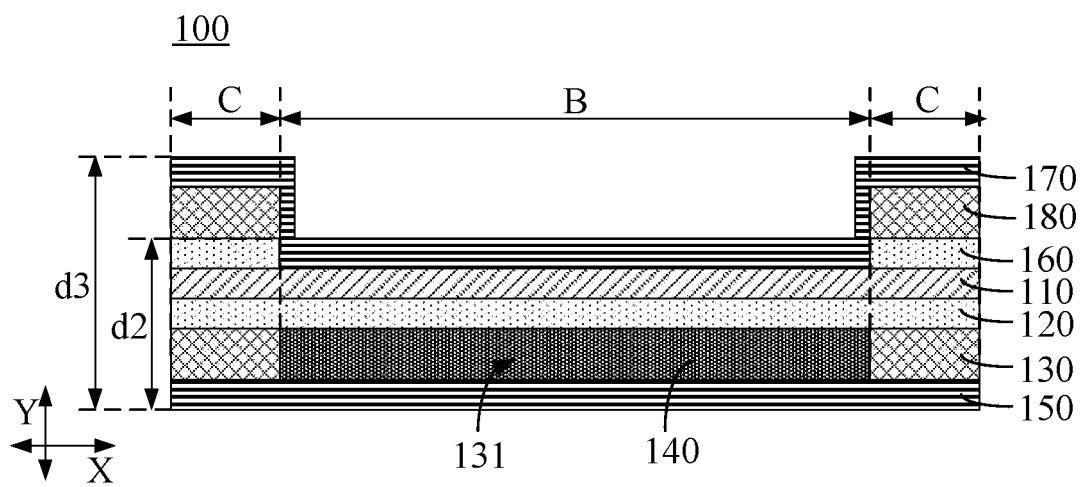
FIG. 5 is a sectional view of the structure in FIG. 3 taken along the II-II' line.

On this basis, as shown in FIGS. 3 to 5, the FPC 100 provided in the embodiments of the present disclosure is located on a back side of the display panel 200, and the back side of the display panel 200 is a side opposite to a display side of the display panel 200. For example, the back side of the display panel 200 is a side of the display panel 200 away from the protective cover plate 600.

The FPC 100 includes a substrate 110, a first conductive layer 120, a first protective layer 130, and a support body 140. The first conductive layer 120 is located on a back side of the substrate 110, and the first protective layer 130 is located on a side of the first conductive layer 120 away from the substrate 110.

A material of the substrate 110 may include a flexible material such that the substrate 110 has flexibility, thereby enabling bending and deformation of the substrate 110. The flexible material may include an organic material (e.g., PET, PI, or COP) or other suitable materials, which is not limited here.

As shown in FIG. 3, in some embodiments, the substrate 110 has a device region A and a non-device region B in a first direction X. The device region A and the non-device region B are spaced apart, and an area of the non-device region B may be greater than an area of the device region A. As shown in FIGS. 4 and 5, a dimension d1, in a direction perpendicular to the substrate 110 (a second direction Y), of a portion of the FPC 100 located in the device region A may be greater than a dimension d2, in the direction perpendicular to the substrate 110, of a portion of the FPC 100 located in the non-device region B.

As shown in FIG. 4, an external chip 800 may be coupled to the FPC 100 in the device region A. The chip 800 may be a driver integrated circuit (IC) or the like, which is not limited here.

In some embodiments, as shown in FIG. 3, the substrate 110 further has a transition region C. The transition region C may be located outside the device region A and the non-device region B. For example, the transition region C is located between the device region A and the non-device region B. As shown in FIG. 4, a dimension d3, in the direction perpendicular to the substrate 110, of a portion of the FPC 100 located in the transition region C may be greater than the dimension d1, in the direction perpendicular to the substrate 110, of the portion of the FPC 100 located in the device region A.

The first conductive layer 120 may be in direct contact with the substrate 110. That is, the first conductive layer 120 is disposed on the substrate. The first conductive layer 120 may be a whole-layer structure or pattern structures, which is not limited here. The first conductive layer 120 may be located on a back surface of the substrate 110. For example, the first conductive layer 120 is located in the device region A, the non-device region B and the transition region C.

A material of the first conductive layer 120 may include a metal material, such as copper (Cu), or may be other suitable materials. In a case where the material of the first conductive layer 120 includes copper, the first conductive layer 120 may be a copper foil.

Figure 6:
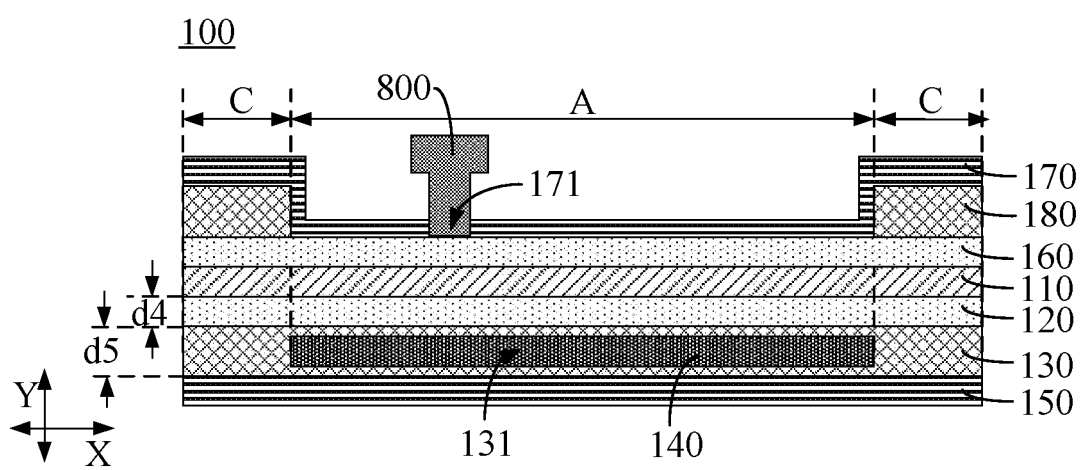
FIG. 6 is another sectional view of the structure in FIG. 3 taken along the I-I' line.

As shown in FIG. 6, a dimension d4 of the first conductive layer 120 in the second direction Y may be in a range from 10 μm to 24 μm, such as 10 μm, 13 μm, 15.4 μm, 17.8 μm, 20 μm, 23.8 μm, or 24 μm.

The first protective layer 130 may be in direct contact with the first conductive layer 120. That is, the first protective layer 130 is disposed on the first conductive layer 120. The first protective layer 130 may cover a back surface of the first conductive layer 120. For example, the first protective layer 130 covers the device region A, the non-device region B and the transition region C.

A material of the first protective layer 130 may include an insulating material. In some examples, the first protective layer 130 includes an insulating film and an adhesive layer, and two surfaces of the adhesive layer are respectively connected to the insulating film and the first conductive layer 120.

As shown in FIG. 6, in some embodiments, a dimension d5 of the first protective layer 130 in the direction perpendicular to the substrate 110 is greater than the dimension d4 of the first conductive layer 120 in the direction perpendicular to the substrate 110.

The dimension d5 of the first protective layer 130 in the second direction Y may be in a range from 30 μm to 40 μm, such as 30 μm, 31.7 μm, 32.5 μm, 35 μm, 37.5 μm, 38.4 μm, or 40 μm.

In some embodiments, the dimension d4 of the first conductive layer 120 in the second direction Y may be 24 μm, and the dimension d5 of the first protective layer 130 in the second direction Y may be 30 μm. That is, a ratio of the dimension d4 of the first conductive layer 120 in the second direction Y to the dimension d5 of the first protective layer 130 in the second direction Y is 4:5.

In some other embodiments, the dimension d4 of the first conductive layer 120 in the second direction Y may be 10 μm, and the dimension d5 of the first protective layer 130 in the second direction Y may be 40 μm. That is, the ratio of the dimension d4 of the first conductive layer 120 in the second direction Y to the dimension d5 of the first protective layer 130 in the second direction Y is 1:4.

Therefore, the ratio of the dimension d4 of the first conductive layer 120 in the second direction Y to the dimension d5 of the first protective layer 130 in the second direction Y may be in a range from 0.25 to 0.8.

As shown in FIGS. 4 to 9, the first protective layer 130 is provided with therein an accommodation space 131. The support body 140 is at least partially located in the accommodation space 131. For example, the entire support body 140 is located in the accommodation space 131. As another example, a part of the support body 140 is located in the accommodation space 131, and another part of the support body 140 is located outside the accommodation space 131.

A structural strength of the support body 140 is greater than a structural strength of the substrate 110. The structural strength may be understood as the deformation resistance ability (such as bending resistance and breaking resistance). The greater the structural strength of the object, the stronger the deformation resistance ability of the object.

In some embodiments, as shown in FIG. 6, the accommodation space 131 may be a closed space located inside the first protective layer 130. That is, the first protective layer 130 completely surrounds the accommodation space 131. In this case, the support body 140 may be entirely located in the accommodation space 131.

Figure 7:
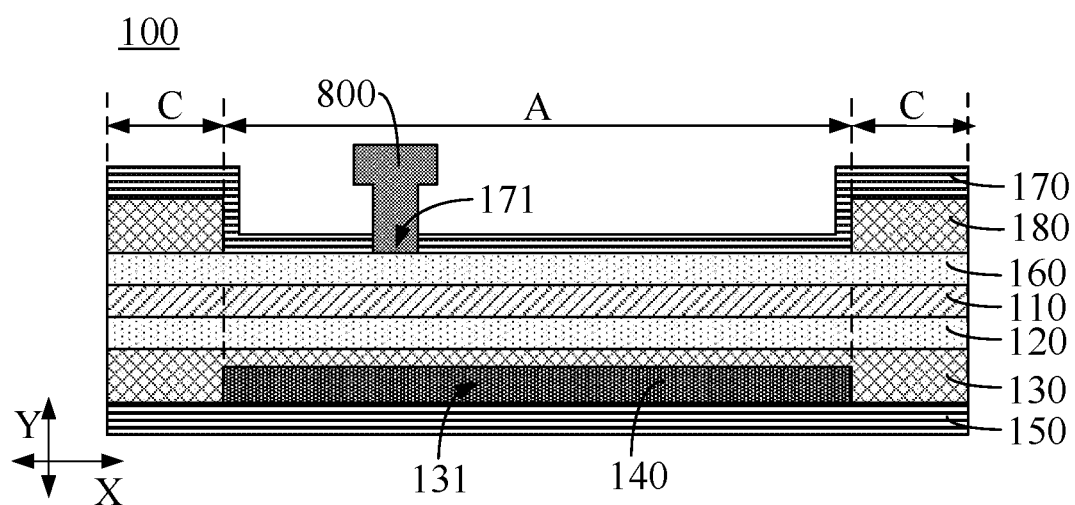
FIG. 7 is yet another sectional view of the structure in FIG. 3 taken along the I-I' line.
Figure 8:
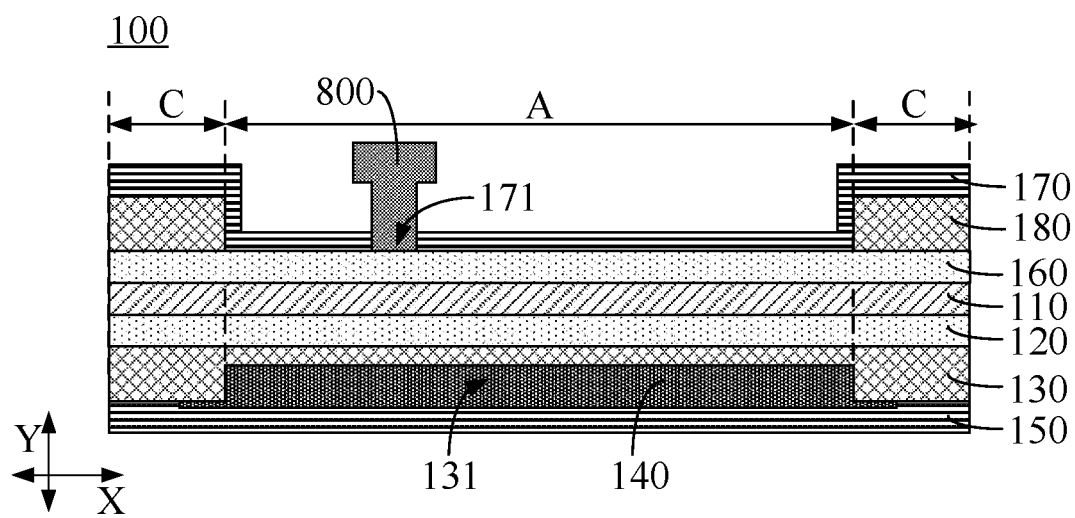
FIG. 8 is yet another sectional view of the structure in FIG. 3 taken along the I-I' line.
Figure 9:
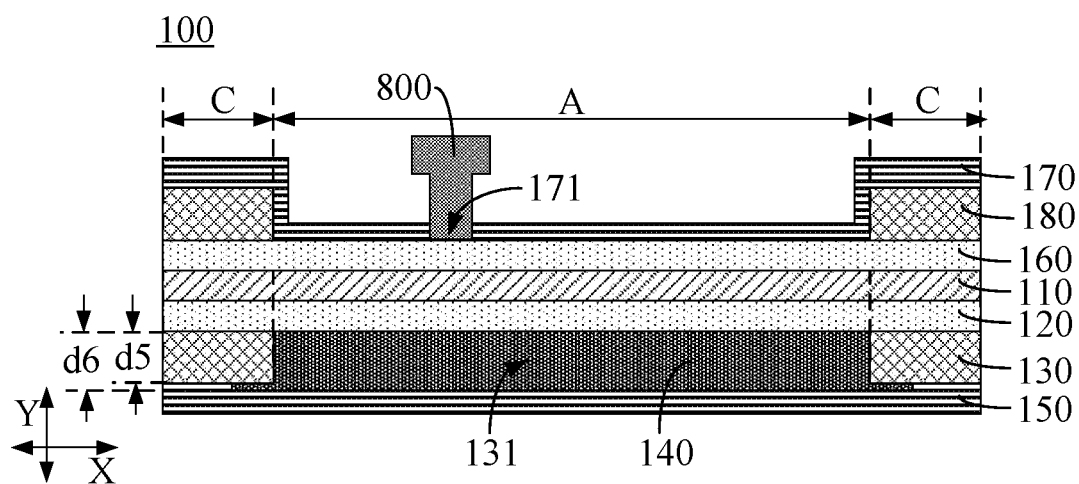
FIG. 9 is yet another sectional view of the structure in FIG. 3 taken along the I-I' line.

In some embodiments, as shown in FIGS. 7 to 9, the accommodation space 131 may also be an open space communicating with other film layers. That is, the first protective layer 130 partially surrounds the accommodation space 131. In this case, the entire support body 140 may be located in the accommodation space 131. Alternatively, a part of the support body 140 may be located in the accommodation space 131, and another part of the support body 140 may be located outside the accommodation space 131.

In some examples, the accommodation space 131 may be a groove. That is, a side of the accommodation space 131 in the second direction Y communicates with other film layers, as shown in FIG. 7.

In this case, the support body 140 may be entirely filled in the groove, as shown in FIG. 7. Alternatively, a part of the support body 140 may fill the groove, and another part of the support body 140 extends and distributes around an opening of the groove, as shown in FIG. 8.

In some examples, the accommodation space 131 may also be a through hole penetrating through the first protective layer 130. That is, two sides of the accommodation space 131 in the second direction Y communicate with other film layers, as shown in FIGS. 4 and 9.

In this case, the support body 140 may be entirely filled in the through hole, as shown in FIGS. 4 and 5. Alternatively, a part of the support body 140 may fill the through hole, and another part of the support body 140 extends and distributes around an opening of the through hole, as shown in FIG. 9.

In a case where the accommodation space 131 is the through hole penetrating through the first protective layer 130, the support body 140 filled in the through hole also penetrates through the first protective layer 130.

In some embodiments, as shown in FIGS. 4 and 5, a dimension of the support body 140 in the direction perpendicular to the substrate 110 is equal to the dimension of the first protective layer 130 in the direction perpendicular to the substrate 110.

In some examples, the accommodation space 131 is a through hole penetrating through the first protective layer 130, and the support body 140 fills the entire through hole. In this case, the dimension of the support body 140 in the second direction Y is equal to the dimension of the first protective layer 130 in the second direction Y.

In some embodiments, as shown in FIG. 9, the dimension d6 of the support body 140 in the direction perpendicular to the substrate 110 is greater than the dimension d5 of the first protective layer 130 in the direction perpendicular to the substrate 110.

In some examples, the accommodation space 131 is a through hole penetrating through the first protective layer 130, a part of the support body 140 fills the entire through hole, and another part of the support body 140 overflows from the through hole. In this case, the dimension of the support body 140 in the second direction Y is greater than the dimension of the first protective layer 130 in the second direction Y.

In some embodiments, an orthographic projection of the support body 140 on the substrate 110 at least overlaps with the device region A of the substrate 110, so that the structural strength of the FPC 100 in the device region A can be improved. Compared with the related art, the supporting ability of FPC in the device region is improved during the SMT process, which avoids deformation such as bending in the device region A, and in turn ameliorates or even avoids the abnormal mounting (e.g., faulty mounting, Tin missing, or displacement), so as to improve the production yield of the FPC 100.

In some embodiments, the orthographic projection of the support body 140 on the substrate 110 at least overlaps with the non-device region B of the substrate 110, so that the structural strength of the FPC 100 in the non-device region B can be improved. Compared with the related art, during the reflow soldering after the SMT process is finished, in a case where the stress of the FPC is concentrated in the non-device region B when the "thermal expansion" occurs inside the FPC in a high temperature environment, the deformation resistance ability of the FPC 100 in the non-display region B can be improved, which ameliorates and even avoids the deformation (such as wrinkles, warping, etc.), and improves the production yield of the FPC 100.

Figure 10:
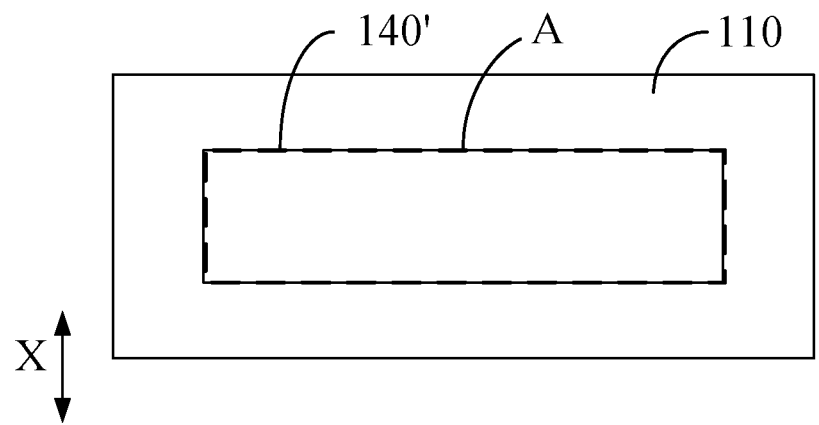
FIG. 10 is a diagram showing a position of a projection of a support body of a flexible printed circuit board on a substrate, in accordance with some embodiments.
Figure 11:
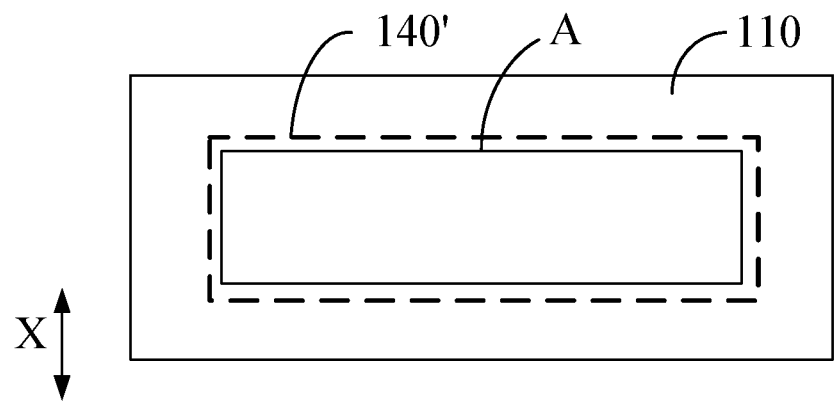
FIG. 11 is a diagram showing a position of a projection of a support body of a flexible printed circuit board on a substrate, in accordance with some other embodiments.

As shown in FIGS. 10 and 11, in some embodiments, the device region A of the substrate 110 is located in the orthographic projection 140' of the support body 140 on the substrate 110.

As shown in FIG. 10, in some examples, the orthographic projection 140' of the support body 140 on the substrate 110 substantially coincides with the device region A of the substrate 110. For example, the orthographic projection 140', on the substrate 110, of the support body 140 in FIG. 4 may substantially coincide with the device region A of the substrate 110. In this case, a border of the orthographic projection 140' of the support body 140 on the substrate 110 substantially coincides with a border of the device region A.

As shown in FIG. 11, in some other examples, the device region A of the substrate 110 and a peripheral region of the device region A (e.g., a part of the transition region C) are located in the orthographic projection 140' of the support body 140 on the substrate 110. For example, the device region A of the substrate 110 and the peripheral region of the device region A may be located in the orthographic projection 140', on the substrate 110, of the support body 140 in FIGS. 8 and 9. In this case, the border of the orthographic projection 140' of the support body 140 on the substrate 110 surrounds the border of the device region A.

In this embodiment, the support body 140 can improve the support strength of each position in the device region A, which avoids bending and other deformations in the device region A, and in turn avoids the abnormal mounting (e.g., faulty mounting, Tin missing, or displacement), so as to improve the production yield of the FPC 100.

Figure 12:
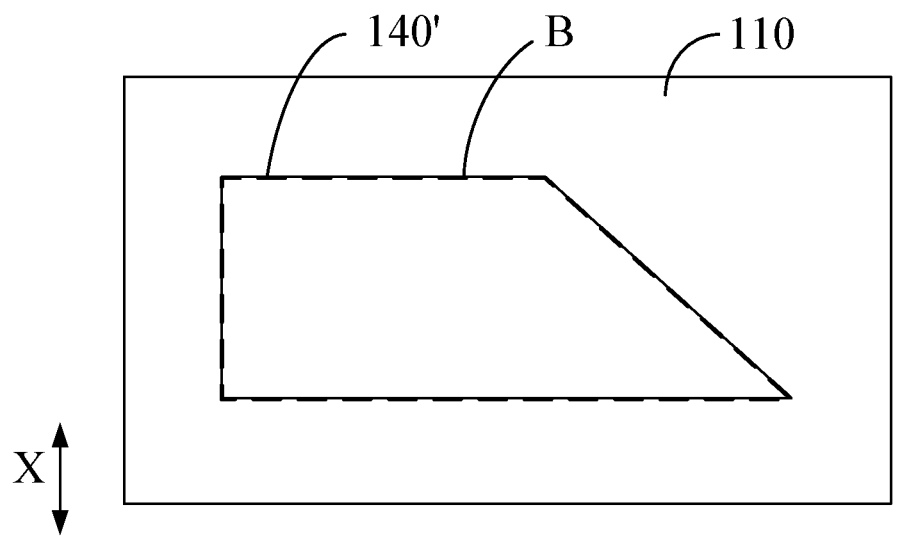
FIG. 12 is a diagram showing a position of a projection of a support body of a flexible printed circuit board on a substrate, in accordance with some other embodiments.

As shown in FIG. 12, in some embodiments, the orthographic projection 140' of the support body 140 on the substrate 110 is located in the non-device region B of the substrate 110.

As shown in FIG. 12, in some examples, the orthographic projection 140' of the support body 140 on the substrate 110 substantially coincides with the non-device region B of the substrate 110. For example, the orthographic projection 140', on the substrate 110, of the support body 140 in FIG. 5 may substantially coincide with the non-device region B of the substrate 110. In this case, the border of the orthographic projection 140' of the support body 140 on the substrate 110 substantially coincides with the border of the non-device region B.

In this embodiment, the support body 140 can improve the structural strength of each position in the non-device region B, and can improve the deformation resistance ability of the FPC 100 in the non-device region B, which avoids the deformation (such as wrinkles, warping, etc.), so as to improve the production yield of the FPC 100.

In some embodiments, a material of the support body 140 includes polypropylene (PP adhesive). Polypropylene can be cured in a high temperature environment, thus having a high structural strength.

In some examples, in a case where the orthographic projection of the support body 140 on the substrate 110 at least overlaps with the device region A of the substrate 110, during the SMT process, the polypropylene is cured in a high temperature environment, so that the supporting ability of the FPC in the device region A is improved, which prevents the FPC from bending and other deformations in the device region A. Therefore, the production yield of the FPC 100 is improved.

After the SMT process is finished, the polypropylene softens after the ambient temperature is lowered. In this way, the support body 140 will not affect the flexibility of the FPC in the device region A, thereby ensuring the bending performance of the FPC.

In some examples, when the orthographic projection of the support body 140 on the substrate 110 at least overlaps with the non-device region B of the substrate 110, during the reflow soldering process after the SMT process, the polypropylene is cured in a high temperature environment, so that the deformation resistance ability of the FPC 100 in the non-device region B is improved, which avoids the deformation (such as wrinkles, warping, etc.), and improves the production yield of the FPC 100.

After the reflow soldering process is finished, the polypropylene softens after the ambient temperature is lowered. In this way, the support body 140 will not affect the flexibility of the FPC in the non-device region B, thereby ensuring the bending performance of the FPC.

In some embodiments, as shown in FIGS. 4 to 9, the FPC 100 further includes a first shielding layer 150. The first shielding layer 150 is located on a side of the first protective layer 130 away from the substrate 110, and covers the first protective layer 130 and the support body 140.

A material of the first shielding layer 150 may include an electromagnetic shielding material, for example, an electromagnetic shielding material prepared by adding carbon fibers to a polymer resin matrix. Of course, the material of the first shielding layer 150 may also be other suitable electromagnetic shielding materials, which is only for illustration, not limitation.

The first shielding layer 150 is a continuous film layer. That is, the first shielding layer 150 covers a surface of the first protective layer 130 away from the substrate 110, and covers the support body 140 located in the accommodation space 131, thereby realizing the covering of the first conductive layer 120.

The first shielding layer 150 may be an electromagnetic interference (EMI) shielding film. The first shielding layer 150 is configured to shield a signal transmitted in the first conductive layer 120, so as to avoid electromagnetic interference.

In some embodiments, as shown in FIGS. 6 to 9, the FPC 100 further includes a second conductive layer 160 and a second shielding layer 170. The second conductive layer 160 is located on a side of the substrate 110 away from the first conductive layer 120, and is located in a region outside the non-device region B. The second shielding layer 170 is located on the side of the substrate 110 away from the first conductive layer 120. The second shielding layer 170 covers the second conductive layer 160 and an exposed surface of the substrate 110 in the non-device region B.

The second conductive layer 160 may be in direct contact with the substrate 110. That is, the second conductive layer 160 is disposed on the substrate. The second conductive layer 160 may be a whole layer structure or pattern structures, which is not limited here.

The second conductive layer 160 may be located on a surface, away from the first conductive layer 120, of the substrate 110 in the device region A. In a case where the substrate 110 further has the transition region C, the second conductive layer 160 may also be located on a surface, away from the first conductive layer 120, of the substrate 110 in the transition region C.

The second conductive layer 160 and the first conductive layer 120 may be made of a similar or same material. A dimension of the second conductive layer 160 in the second direction Y may be close to or equal to the dimension of the first conductive layer 120 in the second direction Y. For example, the dimension of the second conductive layer 160 in the second direction Y is 25 μm, and the dimension of the first conductive layer 120 in the second direction Y is 25.1 μm.

A portion of the second shielding layer 170 in the device region A may be in direct contact with the second conductive layer 160. That is, the portion of the second shielding layer 170 in the device region A is disposed on the first conductive layer 120. The second shielding layer 170 is a continuous film layer. That is, the second shielding layer 170 may cover a surface of the first conductive layer 160 away from the substrate 110, and may cover side surface(s) of the first conductive layer 160 perpendicular to the substrate 110 (e.g., surface(s) of the first conductive layer 160 proximate to the non-device region B).

A portion of the second shielding layer 170 in the non-device region B may also be in direct contact with the substrate 110. That is, the portion of the second shielding layer 170 in the non-device region B is disposed on the substrate 110. The second shielding layer 170 may cover the exposed surface of the substrate 110 in the non-device region B.

In some examples, the substrate 110 further has the transition region C, and the FPC 100 may further include a second protective layer 180. The second protective layer 180 may be in direct contact with a portion of the second conductive layer 160 in the transition region C. That is, the second protective layer 180 is disposed on the portion of the second conductive layer 160 in the transition region C. The second protective layer 180 may cover a surface of the portion of the second conductive layer 160 away from the substrate 110.

The second protective layer 180 and the first protective layer 130 may be made of a similar or same material. A dimension of the second protective layer 180 in the second direction Y may be close to or equal to the dimension of the first protective layer 130 in the second direction Y. For example, the dimension of the second protective layer 180 in the second direction Y is 30 μm, and the dimension of the first protective layer 130 in the second direction Y is 30.1 μm.

In this example, the second shielding layer 170 may be in direct contact with the second protective layer 180 in the transition region C. That is, a portion of the second shielding layer 170 in the transition region C is disposed on the second protective layer 180. The second shielding layer 170 may cover a surface of the second protective layer 180 away from the substrate 110, and may cover side surface(s) of the second protective layer 180 perpendicular to the substrate 110 (e.g., surface(s) of the second protective layer 180 proximate to the non-device region B).

In some embodiments, as shown in FIGS. 6 to 9, the second shielding layer 170 includes a connection opening 171 penetrating through the second shielding layer 170, and the chip 800 is coupled to the second conductive layer 160 through the connection opening 171.

The connection opening 171 is disposed in the device region A. There may be one or more connection openings 171 in the device region A, which is not limited here. In addition, opening sizes of a plurality of connection openings 171 in a direction perpendicular to the second direction Y may be unified. For example, the opening sizes of the plurality of connection openings 171 in the direction perpendicular to the second direction Y are all the same. Alternatively, the opening sizes of the plurality of connection openings 171 in the direction perpendicular to the second direction Y are different. For example, opening sizes of some connection openings 171 in the direction perpendicular to the second direction Y are greater than opening sizes of other connection openings 171 in the direction perpendicular to the second direction Y.

An opening shape of the connection opening 171 may be a rectangle, a circle, an ellipse, a regular polygon, etc., which is not limited here. In addition, opening shapes of a plurality of connection openings 171 may be unified. For example, the opening shapes of the plurality of connection openings 171 are all rectangular. Alternatively, the opening shapes of the plurality of connection openings 171 may be different. For example, opening shapes of some connection openings 171 are circular, and opening shapes of other connection openings 171 are rectangular.

Pin(s) of the chip 800 are coupled to the second conductive layer 160 passing through the connection opening(s) 171 that penetrate through the second shielding layer 170. The opening shapes and opening sizes of the connection opening(s) 171 may depend on the sizes and shapes of the pin(s) of the actual chip 800 passing through the connection opening(s) 171.

It should be noted that portions, located in the device region A, the non-device region B and the transition region C, of any one of the first conductive layer 120, the first protective layer 130, the first shielding layer 150, the second conductive layer 160, the second protective layer 180 and the second shielding layer 170 have the same dimension in the second direction Y. For example, a dimension of a portion, located in the device region A, of the first conductive layer 120 in the second direction Y is equal to a dimension of a portion, located in the non-device region B, of the first conductive layer 120 in the second direction Y, and is equal to a dimension of a portion, located in the transition region C, of the first conductive layer 120 in the second direction Y.

As shown in FIG. 13, embodiments of the present disclosure provide a display device 1000. The display device 1000 includes a display panel 200 and an FPC 100.

The FPC 100 is located on a back side of the display panel 200, and is coupled to the display panel 200. The FPC 100 is the FPC 100 as described in any of the above embodiments.

In some embodiments, a surface of the display panel 200 proximate to the FPC 100 is provided with a protruding portion 290. At least part of the protruding portion 290 is fitted into the non-device region B of the FPC 100.

The protruding portion 290 may be a chip-on-film that is bonded to circuit(s) on a side of the display panel 200 away from the FPC 100 and arranged on a back side of the FPC 100 after being bent, or may be other suitable structure, which is not limited here.

As shown in FIG. 13, the description that at least part of the protruding portion 290 is fitted into the non-device region B of the FPC 100 may be understood that, the protruding portion 290 is located in the non-device region B, and in the second direction Y, a distance d7 between a surface, proximate to the FPC 100, of the protruding portion 290 and the substrate 110 is less than a maximum value of a distance d8 between a surface, proximate to the display panel 200, of the FPC 100 and the substrate 110 (e.g., a distance between a surface, proximate to the display panel 200, of the second shielding layer 170 in the transition region C and the substrate 110).

In other words, there is no second conductive layer 160 and no second protective portion 180 in the non-device region B, so that the FPC 100 is provided with a depression AX in the non-device region B. The protruding portion 290 of the display panel 200 is at least partially fitted into the depression AX.

In this way, at least part of the protruding portion of the display panel 200 can be accommodated by the FPC 100, thereby optimizing the internal space of the display device 1000 and facilitating the lightness and thinness of the display device 1000.

Figure 14:
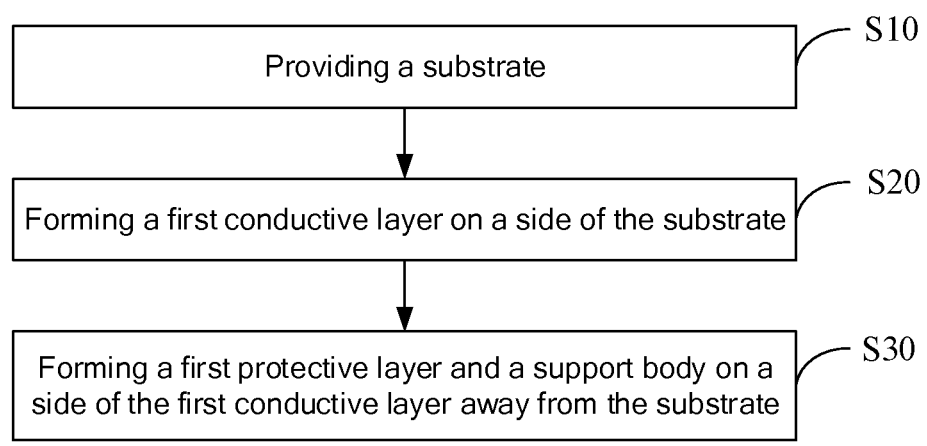
FIG. 14 is a flow diagram of a method for manufacturing a flexible printed circuit board, in accordance with some embodiments.

Some embodiments of the present disclosure provide a method for manufacturing an FPC. As shown in FIG. 14, the method for manufacturing the FPC includes steps S10 to S30.

In step S10, a substrate 110 is provided. The substrate 110 has a device region A and a non-device region B.

A material of the substrate 110 may include a flexible material such that the substrate 110 has flexibility, thereby enabling bending and deformation of the substrate 110. The flexible material may include an organic material (e.g., PET, PI, or COP) or other suitable materials, which is not limited here.

As shown in FIG. 3, in some embodiments, the substrate 110 has the device region A and the non-device region B in a first direction X. The device region A and the non-device region B are spaced apart, and an area of the non-device region B may be greater than an area of the device region A. As shown in FIGS. 4 and 5, a dimension d1, in a direction perpendicular to the substrate 110 (a second direction Y), of a portion of the FPC 100 located in the device region A may be greater than a dimension d2, in the direction perpendicular to the substrate 110, of a portion of the FPC 100 located in the non-device region B.

As shown in FIG. 4, an external chip 800 may be coupled to the FPC 100 in the device region A. The chip 800 may be a driver IC or the like, which is not limited here.

In some embodiments, as shown in FIG. 3, the substrate 110 further has a transition region C. The transition region C may be located outside the device region A and the non-device region B. For example, the transition region C is located between the device region A and the non-device region B. As shown in FIG. 4, a dimension d3, in the direction perpendicular to the substrate 110, of a portion of the FPC 100 located in the transition region C may be greater than the dimension d1, in the direction perpendicular to the substrate 110, of the portion of the FPC 100 located in the device region A.

In step S20, a first conductive layer 120 is formed on a side of the substrate 110.

In some examples, a conductive material may be deposited on a back side of the substrate 110 using a deposition process, so as to form a first conductive material layer on the back side of the substrate 110. In a case where the conductive material is a metal material (such as copper (Cu)), the first conductive material layer may be formed by depositing the metal material through magnetron sputtering.

Then, the first conductive material layer undergoes processing (e.g., drying, curing, etching, etc.) to obtain the first conductive layer 120. The first conductive layer 120 may be a whole-layer structure or pattern structures, which is not limited here.

The first conductive layer 120 may be in direct contact with the substrate 110. That is, the first conductive layer 120 is formed on the substrate 110. The first conductive layer 120 may be located on a back surface of the substrate 110. For example, the first conductive layer 120 is located in the device region A, the non-device region B and the transition region C.

In step S30, a first protective layer 130 and a support body 140 are formed on a side of the first conductive layer 120 away from the substrate 110; the first protective layer 130 is provided therein with an accommodation space 131, and the support body 140 is at least partially located in the accommodation space 131; and an orthographic projection of the support body 140 on the substrate 110 at least overlaps with the device region A of the substrate 110 and/or the non-device region B of the substrate 110.

Figure 15:
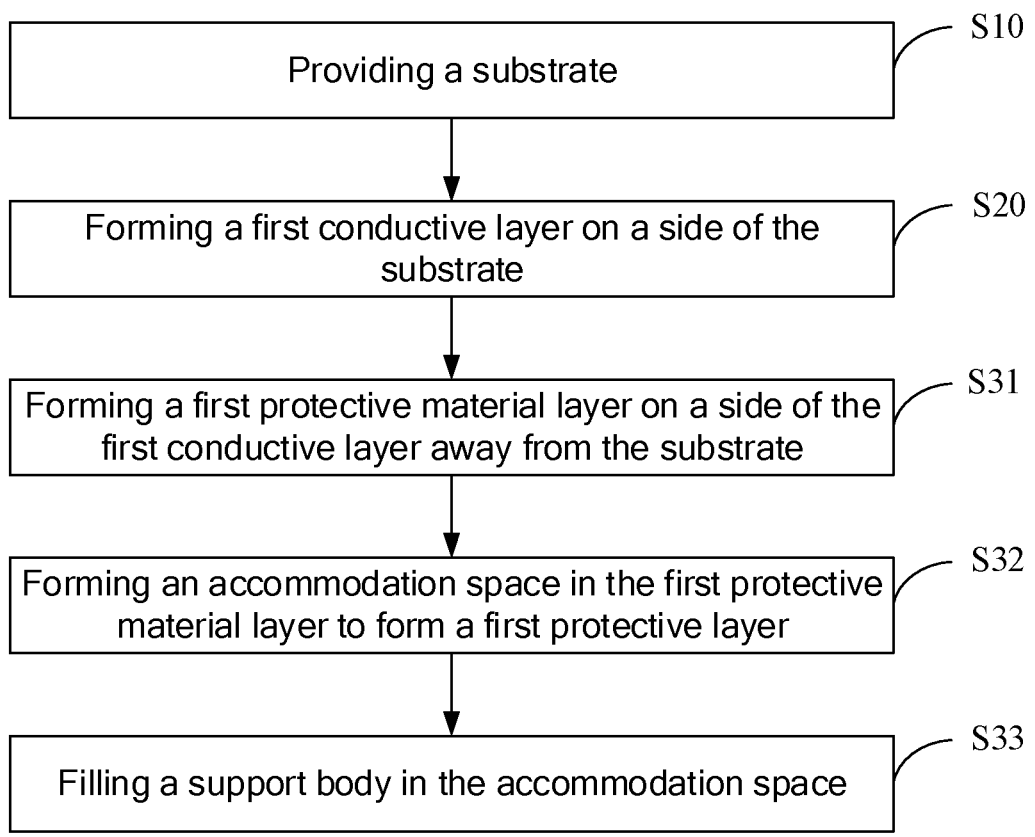
FIG. 15 is a flow diagram of a method for manufacturing a flexible printed circuit board, in accordance with some embodiments.

In some examples, as shown in FIG. 15, the step S30 may include steps S31 to S33.

In step S31, a first protective material layer is formed on the side of the first conductive layer 120 away from the substrate 110.

A back of the first conductive layer 120 may be coated with a protective material, so as to form the first protective material layer. The protective material may include an insulating material, such as insulating ink.

In step S32, forming an accommodation space 131 in the first protective material layer, so as to form the first protective layer 130.

The accommodation space 131 may be formed in the first protective material layer by using an etching process. The etching process may be a dry etching process or a wet etching process, which is not limited here.

The accommodation space 131 may be a through hole penetrating through the first protective material layer, or may be a groove recessed in the first protective material layer, which is not limited here.

In some examples, an orthogonal projection of a border of the accommodation space 131 on the substrate 110 at least overlaps with the device region A of the substrate 110. In some other examples, the orthographic projection of the border of the accommodation space 131 on the substrate 110 at least overlaps with the non-device region B of the substrate 110. In yet some other examples, the orthogonal projection of the border of the accommodation space 131 on the substrate 110 at least overlaps with the device region A of the substrate 110, and at least overlaps with the non-device region B of the substrate 110.

The first protective layer 130 may be formed after the accommodation space 131 is formed in the first protective material layer. In some examples, after the accommodation space 131 is formed in the first protective material layer, the first protective material layer may be molded after undergoing processing (e.g., drying, curing, pressing, etc.), so as to form the first protective layer 130.

In step S33, the support body 140 is filled in the accommodation space 131.

For example, a nozzle may be aimed at the accommodation space 131, and a support material is filled in the accommodation space 131 by using the nozzle, so as to form the support body 140. Of course, the support material may be filled in the accommodation space 131 by other manners. The above description is only for illustration and should not be regarded as a limitation.

A support material is filled in the accommodation space 131 to form the support body 140. In some examples, the support material filled in the accommodation space 131 may be molded after undergoing processing (e.g., drying, curing, pressing, etc.), thus forming the support body 140.

The first protective material layer and the cured material may be processed and molded separately, or may be processed and molded simultaneously, which is not limited here.

In this example, the accommodation space 131 may be an open space. By using the method for manufacturing the FPC provided in this example, the first protective layer 130 and the support body 140 as shown in FIGS. 7 to 9 can be formed.

Figure 16:
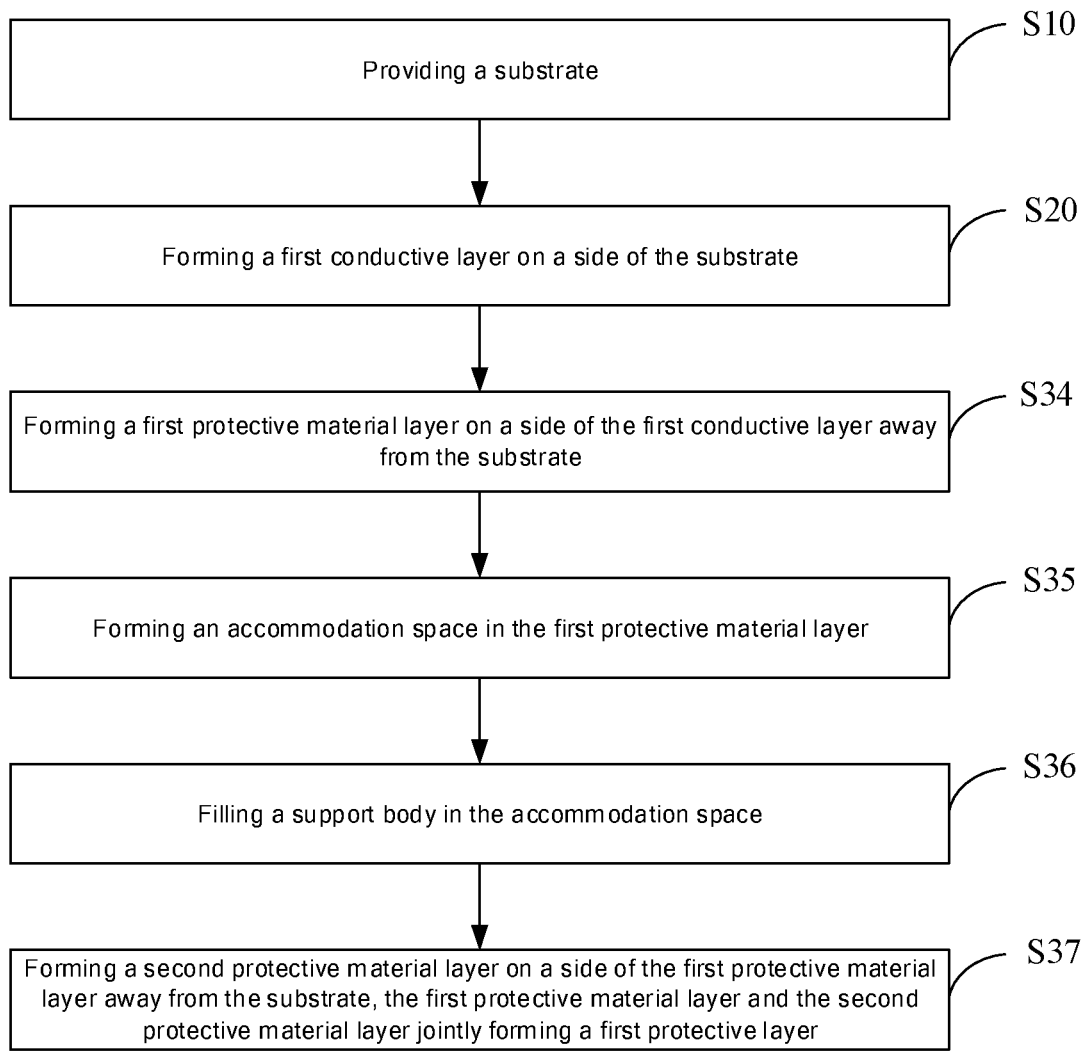
FIG. 16 is a flow diagram of a method for manufacturing a flexible printed circuit board, in accordance with some embodiments.

In some other examples, as shown in FIG. 16, the step S30 may include step S34 to step S37.

In step S34, a first protective material layer is formed on a side of the first conductive layer away from the substrate.

In step S35, an accommodation space is formed in the first protective material layer.

In step S36, the support body is filled in the accommodation space 131.

In step S37, a second protective material layer is formed on a side of the first protective material layer away from the substrate 110, the first protective material layer and the second protective material layer jointly form the first protective layer; and the second protective material layer covers the first protective material layer and support body 140.

That is, the second protective material layer covers a surface of the first protective material layer away from the substrate 110, and covers a surface of the support body 140 away from the substrate 110.

As for the method of forming the second protective material layer, reference may be made to the method of forming the first protective material layer, and details will not be repeated here.

As for steps S34 to S36, reference may be made to the above description of steps S31 and S33, and the difference lies in that the first protective material layer is not independently formed as the first protective layer 130 in step S35. In some examples, the first protective material layer and the second protective material layer may be molded after undergoing processing (e.g., drying, curing, pressing, etc.), so as to jointly form the first protective layer 130. The first protective material layer and the second protective material layer may be processed and molded separately, or may be processed and molded simultaneously, which is not limited here.

In this way, the accommodation space 131 is surrounded by the first protective material layer and the second protective material layer, so as to form a closed space. By the method provided in this example, the first protective layer 130 and the support body 140 as shown in FIG. 6 can be formed.

Figure 17:
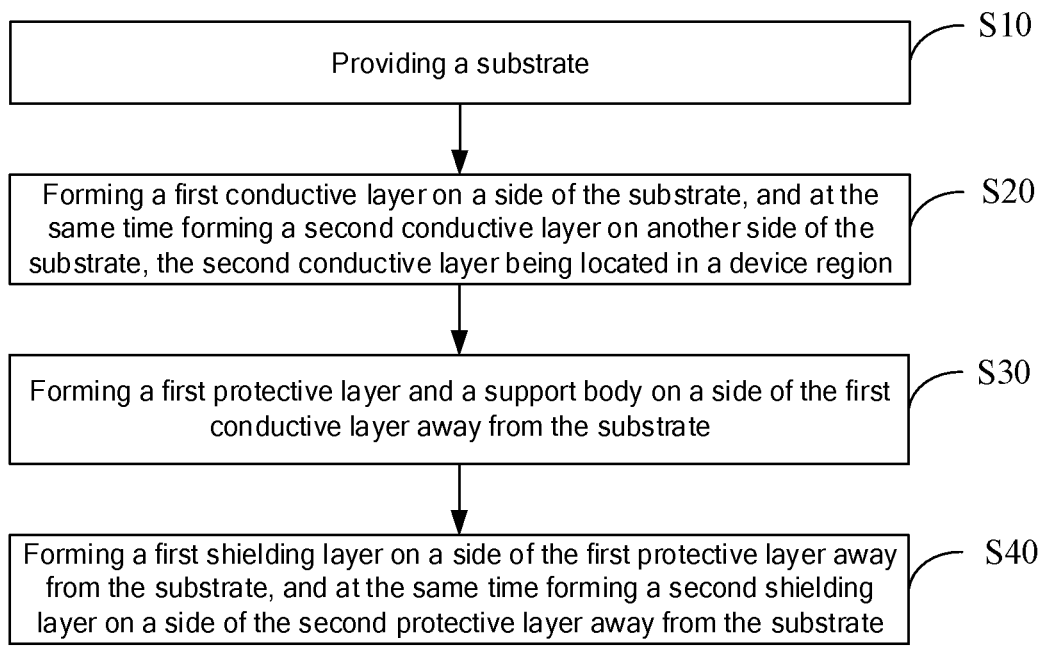
FIG. 17 is a flow diagram of a method for manufacturing a flexible printed circuit board, in accordance with some embodiments.

In some embodiments, as shown in FIG. 17, the step S20 includes: forming a first conductive layer 120 on a side of the substrate 110, and at the same time forming a second conductive layer 160 on another side of the substrate 110, the second conductive layer 160 being located in the device region A.

As for the method for manufacturing the first conductive layer 120, reference may be made to the method for manufacturing the first conductive layer 120, and details will not be repeated here.

In some examples, the second conductive layer 160 may be formed by using a second conductive material layer that is formed on the back side of the substrate 110 by depositing a conductive material on a side of the substrate 110 away from the first conductive layer 120 through a deposition process. In a case where the conductive material is a metal material (such as copper (Cu)), the second conductive material layer may be formed by depositing the metal material by using a magnetron sputtering manner.

Afterwards, the second conductive material layer is etched, so that a portion of the second conductive material layer in the non-device region B is removed to expose the surface of the substrate 110 in the non-device region B, and a portion of the second conductive material layer in the device region A is retained, so as to form the second conductive layer 160. In the device region A, the second conductive layer 160 may be a whole layer structure or pattern structures, which is not limited here.

The second conductive layer 160 may be in direct contact with the substrate 110. That is, the second conductive layer 160 is formed on the substrate 110. In some examples, in a case where the substrate 110 further has the transition region C, the second conductive layer 160 may be further located in the transition region C.

After the step 30, the method further includes step S40.

In step S40, a first shielding layer 150 is formed on a side of the first protective layer 130 away from the substrate 110, and a second shielding layer 170 is formed on a side of the second conductive layer 160 away from the substrate 110. The first shielding layer 150 covers the first protective layer 130 and the support body 140, and the second shielding layer 170 covers the second conductive layer 160 and an exposed surface of the substrate 110 in the non-device region B.

In some examples, an electromagnetic shielding material may be deposited on two sides of the substrate 110 by a deposition process. For example, the electromagnetic shielding material is an electromagnetic shielding material prepared by adding carbon fibers to a polymer resin matrix. Of course, the electromagnetic shielding material may be other suitable electromagnetic shielding materials. This is only for illustration, not limitation.

The first shielding layer 150 covers a surface of the first protective layer 130 away from the substrate 110, and covers the support body 140 located in the accommodation space 131. Therefore, the covering of the first conductive layer 120 is realized, so as to shield the signal transmitted in the first conductive layer 120 and avoid the electromagnetic interference.

The second shielding layer 170 covers a surface of the second conductive layer 160 away from the substrate 110 and the exposed surface of the substrate 110 in the non-device region B. In a case where the FPC 100 further includes the second protective layer 180 located in the transition region C, the second shielding layer 170 further covers a surface of the second protective layer 180 away from the substrate 110. Therefore, the second conductive layer 160 is covered, so as to shield a signal transmitted in the second conductive layer 160 and avoid the electromagnetic interference.

The foregoing descriptions are merely specific implementations of the present disclosure, but the protection scope of the present disclosure is not limited thereto. Any changes or replacements that a person skilled in the art could readily conceive of within the technical scope of the present disclosure shall be included in the protection scope of the present disclosure. Therefore, the protection scope of the present disclosure shall be subject to the protection scope of the claims.

What is claimed is:

1. A flexible printed circuit board, comprising:
   a substrate having a device region and a non-device region, wherein the device region is configured to be coupled to a chip;
   a first conductive layer located on a side of the substrate;
   a first protective layer located on a side of the first conductive layer away from the substrate, wherein the first protective layer is provided therein with an accommodation space;
   a support body located at least in the accommodation space, wherein an orthographic projection of the support body on the substrate at least overlaps with at least one of the device region and the non-device region of the substrate; and
   a first shielding layer located on a side of the first protective layer away from the substrate and covering the first protective layer and the support body.

2. The flexible printed circuit board according to claim 1, wherein the support body penetrates through the first protective layer.

3. The flexible printed circuit board according to claim 1, wherein the device region of the substrate is located in the orthographic projection of the support body on the substrate; and/or
   the orthographic projection of the support body on the substrate is located in the non-device region of the substrate.

4. The flexible printed circuit board according to claim 1, wherein a border of the orthographic projection of the support body on the substrate substantially overlaps with a border the device region; and/or
   the border of the orthographic projection of the support body on the substrate substantially overlaps with a border the non-device region.

5. The flexible printed circuit board according to claim 1, wherein a material of the support body includes polypropylene.

6. The flexible printed circuit board according to claim 1, further comprising:
   a second conductive layer located on a side of the substrate away from the first conductive layer and located in a region outside the non-device region; and
   a second shielding layer located on the side of the substrate away from the first conductive layer, wherein the second shielding layer covers the second conductive layer and an exposed surface of the substrate in the non-device region.

7. The flexible printed circuit board according to claim 1, wherein a dimension of the first protective layer in a direction perpendicular to the substrate is greater than a dimension of the first conductive layer in the direction perpendicular to the substrate.

8. The flexible printed circuit board according to claim 7, wherein a ratio of a dimension of the first conductive layer in a direction perpendicular to the substrate to a dimension of the first protective layer in the direction perpendicular to the substrate is in a range from 0.25 to 0.8.

9. The flexible printed circuit board according to claim 7, wherein a dimension of the support body in a direction perpendicular to the substrate is greater than or equal to a dimension of the first protective layer in the direction perpendicular to the substrate.

10. The flexible printed circuit board according to claim 1, wherein a ratio of a dimension of the first conductive layer in a direction perpendicular to the substrate to a dimension of the first protective layer in the direction perpendicular to the substrate is in a range from 0.25 to 0.8.

11. The flexible printed circuit board according to claim 1, wherein a dimension of the support body in a direction perpendicular to the substrate is greater than or equal to a dimension of the first protective layer in the direction perpendicular to the substrate.

12. A display device, comprising:
a display panel; and
a flexible printed circuit board located on a back side of the display panel and coupled to the display panel, wherein the back side of the display panel is a side opposite to a display side of the display panel, and the flexible printed circuit board is the flexible printed circuit board according to claim 1.

13. The display device according to claim 12, wherein the flexible printed circuit board includes a second conductive layer and a second shielding layer; the second conductive layer is located on a side of the substrate away from the first conductive layer and located in a region outside the non-device region; the second shielding layer is located on the side of the substrate away from the first conductive layer, and the second shielding layer covers the second conductive layer and an exposed surface of the substrate in the non-device region;
a surface of the display panel proximate to the flexible printed circuit board is provided with a protruding portion; and at least part of the protruding portion is fitted into the non-device region of the flexible printed circuit board.

14. The display device according to claim 12, wherein the flexible printed circuit board includes a second conductive layer and a second shielding layer; the second conductive layer is located on a side of the substrate away from the first conductive layer and located in a region outside the non-device region; the second shielding layer is located on the side of the substrate away from the first conductive layer, and the second shielding layer covers the second conductive layer and an exposed surface of the substrate in the non-device region;
the second shielding layer includes a connection opening penetrating through the second shielding layer, and the connection opening is configured such that the chip is coupled to the second conductive layer through the connection opening; and
a surface of the display panel proximate to the flexible printed circuit board is provided with a protruding portion; and at least part of the protruding portion is fitted into the non-device region of the flexible printed circuit board.

15. The flexible printed circuit board according to claim 1, further comprising:
a second conductive layer located on a side of the substrate away from the first conductive layer and located in a region outside the non-device region; and
a second shielding layer located on the side of the substrate away from the first conductive layer, wherein the second shielding layer covers the second conductive layer and an exposed surface of the substrate in the non-device region.

16. A method for manufacturing a flexible printed circuit board, comprising:
providing a substrate, wherein the substrate has a device region and a non-device region;
forming a first conductive layer on a side of the substrate;
forming a first protective layer and a support body on a side of the first conductive layer away from the substrate, wherein the first protective layer is provided therein with an accommodation space, the support body is at least partially located in the accommodation space, and an orthographic projection of the support body on the substrate at least overlaps with at least one of the device region and the non-device region of the substrate; and
forming a first shielding layer on a side of the first protective layer away from the substrate, wherein the first shielding layer covers the first protective layer and the support body.

17. The method according to claim 16, wherein forming the first protective layer and the support body on the side of the first conductive layer away from the substrate includes:
forming the first protective layer on the side of the first conductive layer away from the substrate; and
filling the support body in the accommodation space.

18. A flexible printed circuit board, comprising:
a substrate having a device region and a non-device region, wherein the device region is configured to be coupled to a chip;
a first conductive layer located on a side of the substrate;
a first protective layer located on a side of the first conductive layer away from the substrate, wherein the first protective layer is provided therein with an accommodation space;
a support body located at least in the accommodation space, wherein an orthographic projection of the support body on the substrate at least overlaps with at least one of the device region and the non-device region of the substrate;
a second conductive layer located on a side of the substrate away from the first conductive layer and located in a region outside the non-device region; and
a second shielding layer located on the side of the substrate away from the first conductive layer, wherein the second shielding layer covers the second conductive layer and an exposed surface of the substrate in the non-device region.

19. The flexible printed circuit board according to claim 18, wherein the second shielding layer includes a connection opening penetrating through the second shielding layer, and the connection opening is configured such that the chip is coupled to the second conductive layer through the connection opening.

* * * * *